(12) United States Patent
Kadotani et al.

(10) Patent No.: US 7,804,102 B2
(45) Date of Patent: Sep. 28, 2010

(54) ILLUMINATION DEVICE AND METHOD FOR MANUFACTURING THE SAME

(75) Inventors: Norikazu Kadotani, Hachioji (JP); Koichi Fukasawa, Kofu (JP); Hirohiko Ishii, Minamitsuru-gun (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 0 days.

(21) Appl. No.: 12/260,918

(22) Filed: Oct. 29, 2008

(65) Prior Publication Data

US 2009/0108283 A1    Apr. 30, 2009

(30) Foreign Application Priority Data

Oct. 29, 2007    (JP) .............................. 2007-279834

(51) Int. Cl.
*H01L 29/22* (2006.01)
*H01L 33/00* (2010.01)

(52) U.S. Cl. ........................... 257/98; 257/99; 257/100; 257/E33.059; 257/E33.061; 257/E33.072

(58) Field of Classification Search .................. 257/98, 257/99, 100, E33.059, E33.061, E33.072
See application file for complete search history.

(56) References Cited

U.S. PATENT DOCUMENTS

| | | | | |
|---|---|---|---|---|
| 7,253,448 | B2 * | 8/2007 | Roberts et al. | 257/99 |
| 7,507,010 | B2 * | 3/2009 | Ide | 362/613 |
| 7,560,748 | B2 * | 7/2009 | Ishizaka et al. | 257/99 |
| 2003/0025442 | A1 * | 2/2003 | Takeuchi et al. | 313/495 |
| 2008/0023713 | A1 * | 1/2008 | Maeda et al. | 257/98 |
| 2009/0268437 | A1 * | 10/2009 | Mabuchi | 362/159 |
| 2010/0072416 | A1 * | 3/2010 | Fujioka et al. | 252/67 |
| 2010/0084962 | A1 * | 4/2010 | Winkler et al. | 313/484 |

FOREIGN PATENT DOCUMENTS

JP        200167917 A    3/2001

* cited by examiner

*Primary Examiner*—Ngan Ngo
(74) *Attorney, Agent, or Firm*—Browdy and Neimark, P.L.L.C.

(57) ABSTRACT

An illumination device includes a circuit board (11), an LED element (12) mounted on the circuit board, a light-transmitting sealing resin (16) covering the LED element and containing a fluorescent material, a light reflector (14) covering the light-transmitting sealing resin and reflecting light emitted from the LED element, and a light-guiding part (13) comprising a light-transmitting plate connected to the light-transmitting sealing resin, the light-guiding part guiding the light emitted from the LED element and including a light emission surface (13*a*) configured to emit the light.

11 Claims, 13 Drawing Sheets

ILLUMINATION DEVICE AND METHOD FOR MANUFACTURING THE SAME

CROSS-REFERENCE TO THE RELATED APPLICATION

The application claims the priority benefit of Japanese Patent Application No. 2007-279834, filed on Oct. 29, 2007, the entire descriptions of which are incorporated herein by reference.

BACKGROUND OF THE INVENTION

1. Field of the Invention

The present invention relates to an illumination device and a method for manufacturing the illumination device, more specifically, to an illumination device utilizable as a backlight for a liquid crystal display or a flash light which is installed in mobile phones, mobile information terminals or the like and a method for manufacturing the illumination device.

2. Description of the Related Art

Because recent that mobile terminals such as mobile phones, cameras, mobile information terminals, or the like are required to be miniaturized, a small liquid crystal display having a low power consumption is often used in a display section. The liquid crystal display often includes an edge light-type backlight with a light-guiding plate configured to introduce light from a light source through a side surface of the light-guiding plate to illuminate the display so that characters or images are visible even in a dark place. Such a backlight conventionally includes a planar light-guiding plate with a light-emitting diode (LED) disposed to face a side surface of the light-guiding plate, and a backlight in which an LED is contained in a concave portion provided in the light-guiding plate at a lower surface thereof has been disclosed (for reference, see Japanese Patent Application Publication No. 2001-67917, pages 3 and 4, FIGS. 1 to 3).

A specific structure of an illumination device used as a conventional backlight is described hereinafter with reference to FIGS. 19A to 19C.

As shown in FIGS. 19A to 19C, a conventional illumination device to illuminate a liquid crystal display panel 200 includes a light-guiding plate 1 disposed to face a lower surface of the liquid crystal display panel 200 and an LED element 2 mounted on a flexible substrate 3 and contained in a concave portion 1a which is provided in a lower surface adjacent to one side edge of the light-guiding plate 1.

The lower surface of the light-guiding plate 1 is provided with a scattering reflection layer 1b having an area corresponding to a size of the liquid crystal display panel 200 and including fine concave and convex patterns. A reflection sheet 4 is provided on an upper surface of the light-guiding plate 1 at a position opposite to the concave portion 1a of the lower surface of the light-guiding plate 1. The LED element 2 is bonded to printed wiring patterns on the flexible substrate 3 through wires 2a. A sealing resin layer 6 is provided in the concave portion 1a to seal the LED element 2 in the concave portion 1a.

Note that the flexible substrate 3 is fixed to the light-guiding plate 1 through a reinforcing plate 5 and thus, the flexible substrate 3 is integrated with the light-guiding plate 1. A leading end portion of the flexible substrate 3 is disposed on the lower surface of the light-guiding plate 1 and the LED element 2 is contained in the concave portion 1a. In the illumination device having the aforementioned structure, light emitted from the LED element 2 is guided in the light-guiding plate 1 and emitted from a light emission surface of the light-guiding plate 1 to illuminate the liquid crystal display panel 200.

However, in this structure mentioned above, there are problems that the processes of manufacturing the illumination device include a large number of hand operations such as adherences or the like, variations in quality may arise, and production costs may increase.

SUMMARY OF THE INVENTION

An object of the present invention is to provide an illumination device capable of achieving uniform illumination light and a method of mass-producing the illumination device with a high yield.

To accomplish the above object, an illumination device according to one embodiment of the present invention includes: a circuit board having a mount surface; at least one light-emitting diode element mounted on the mount surface of the circuit board; a light-transmitting sealing resin mounted on the mount surface, covering the light-emitting diode element and containing at least one kind of fluorescent material; the light-transmitting sealing resin having peripheral surfaces and a light-emitting surface that faces the mount surface of the circuit board, and a light reflector layered on and covering the peripheral surfaces of the light-transmitting sealing resin except a light-transmitting surface; and the light reflector configured to reflect light thereon after the light is emitted from the light-emitting diode element in the light-transmitting sealing resin; and a light-transmitting plate connected to light-emitting surface of the light-transmitting sealing resin, the light-transmitting plate including at least one light emission surface, and the light-transmitting plate that receives light through the light-emitting surface of the light-transmitting sealing resin.

The light-transmitting plate is configured to guide light emitted from the light-emitting diode element and emit the light through the light emission surface.

Also, the light reflector disposed on the peripheral surfaces of the light-transmitting sealing resin is defined as a first light reflector and, a second light reflector may be layered on surfaces of the light-transmitting plate except the light emission surface and a surface contacting the light-emitting surface of the light-transmitting sealing resin.

A method for manufacturing an illumination device, according to one embodiment of the present invention, includes mounting a plurality of LED elements on a collective circuit board; forming a light-transmitting sealing resin layer containing at least one kind of fluorescent material on the collective circuit board to cover the plurality of LED elements; forming sealing resin-grooves in the light-transmitting sealing resin layer to divide the light-transmitting sealing resin layer at predetermined intervals lengthwise and crosswise; forming a first light reflector by filling the sealing resin-grooves with a light reflecting resin; forming a light-guiding part comprising a light-transmitting plate on an upper surface of each of the light-transmitting sealing resin layer and the first light reflector; and cutting the collective circuit board including the plurality of light-emitting diode elements, the light-transmitting sealing resin layer, the first light reflector and the light-guiding part at positions corresponding to the sealing resin-grooves to form individual illumination devices.

DETAILED DESCRIPTION OF THE PREFERRED EMBODIMENTS

Preferred embodiments of the present invention will be explained in detail hereinafter with reference to the accompanying drawings.

Figure 1A:
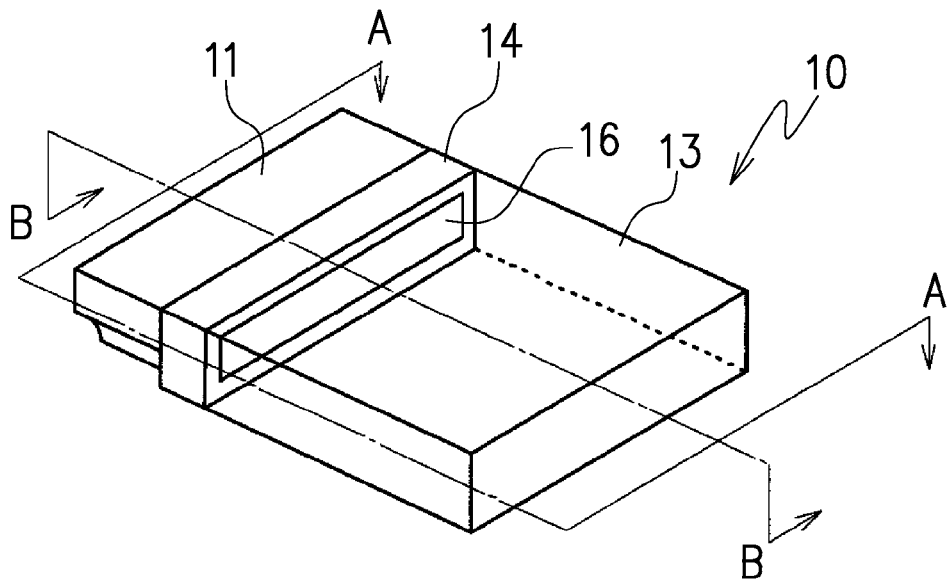
FIG. 1A is a perspective view showing an illumination device according to a first embodiment of the present invention.
Figure 1B:
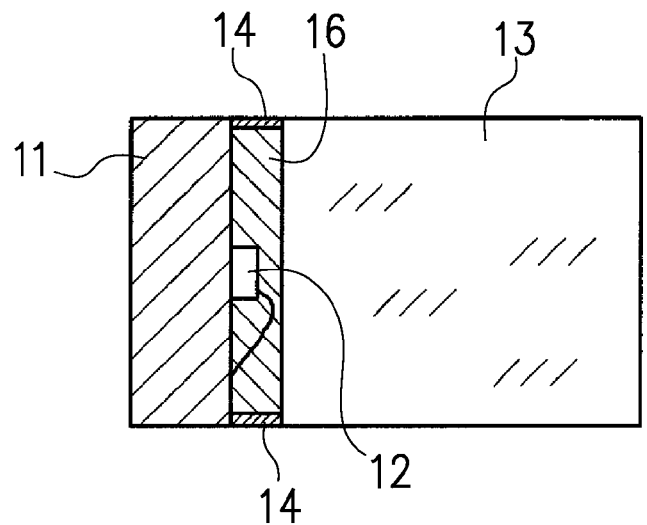
FIG. 1B is a sectional view taken along line A-A in FIG. 1A.
Figure 1C:
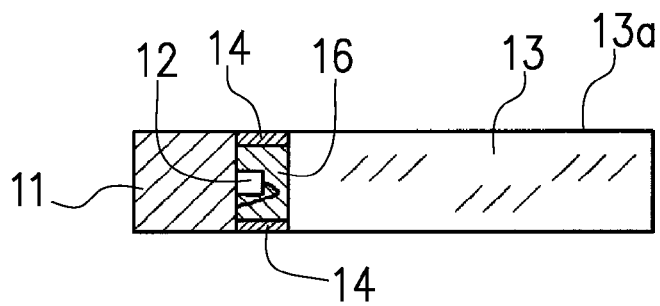
FIG. 1C is a sectional view taken along line B-B in FIG. 1A.

FIGS. 1A to 1C illustrate an illumination device according to a first embodiment of the present invention. The illumination device 10 in a first embodiment as shown in FIGS. 1A to 1C includes a circuit board 11, at least one LED (light emitting diode) element 12 as a light source mounted on a mount surface of the circuit board 11, a light-transmitting sealing resin 16 having a light-transmitting property and containing at least one kind of fluorescent material and disposed on the mount surface to seal the LED element 12, the light-transmitting sealing resin 16 having a light-emitting surface that faces the mount surface of the circuit board 11, and a contact surface that contacts the mount surface of the circuit board 11, and peripheral surfaces between the light-emitting surface and the contact surface, a light-reflecting resin layer or a first light reflector 14 covering the peripheral surfaces of the light-transmitting sealing resin 16 and configured to reflect light emitted from the LED element 12 and a light-guiding part or a light-transmitting plate 13 of resin coupled to the light-emitting surface of the light-transmitting sealing resin 16 and a surface of the first reflector 14, the surface having a substantially same level surface as the light-emitting surface of the light-transmitting sealing resin 16.

In the first embodiment, the illumination device 10 is wholly formed in a rectangular body having a thin-thickness. More specifically, the circuit board 11 has a rectangular shape of thin-thickness. The LED element 12 is mounted on the mount surface of the circuit board 11. The light-transmitting sealing resin 16 is disposed on the mount surface and sealing the LED element 12 in a rectangular parallelepiped, and the light reflector 14 is layered on the peripheral surfaces of the light-transmitting sealing resin 16. The light-transmitting plate 13 coupled to the light-emitting surface of the light-transmitting resin 16 and the surface of the light reflector 14, extends substantially in a width of the mount surface of the circuit board to have a substantially rectangular shape in whole in plan view. The light-transmitting plate 13 is coupled to the light-emitting surface of the light-transmitting sealing resin 16 and the surface of the light reflector 14 mentioned above, and includes a coupled surface coupled to the light-transmitting sealing resin 16 and the light reflector 14, an opposing surface that opposes the coupled surface and peripheral surfaces disposed between the coupled surface and the opposing surface.

The circuit board 11 is made of, for example, glass epoxy resin, a ceramic or the like, and a pair of opposing side surfaces of the circuit board, the opposing side surfaces perpendicular to the mount surface, are provided with anode electrodes and cathode electrodes by half through-holes. The circuit board 11 is provided with electrode patterns (not shown) extending from the both side surfaces to a central portion of the mount surface. The LED element 12 is mounted on the mount surface of the circuit board 11 and electrically connected to the electrode patterns through bonding wires or bumps.

The LED element 12 may comprise, for example, a blue LED containing InGaN or the like, and the light-transmitting sealing resin 16 may be a silicone resin, for example, and include at least one kind of fluorescent material such as YAG:Ce (yttrium aluminum garnet with added cerium). At least one blue LED element 12 sealed with the light-transmitting sealing resin 16 which contains the yellow fluorescent material appears to emit white light obtained by mixing effect of blue light emitted from the blue LED and yellow light through the yellow fluorescent material.

The film-thin reflector or the first reflector 14, which is disposed on and covers the peripheral surfaces of the light-transmitting sealing resin 16 and reflects light emitted from the LED element 12. The first reflector 14 may be made of, for example, a white resin containing titanium oxide or a resin material containing a highly reflecting material such as other metallic particles or the like. For example, epoxy, silicone resin or the like can be used for such a resin material.

The light-guiding part or the light-transmitting plate 13 is made of, for example, silicone resin and includes light emission surfaces 13a, which are formed by the entire exposed surfaces. Thereby, one part of the light emitted from the LED element 12 passes through the light-transmitting sealing resin 16 while being reflected on the first reflector 14, and the reflected light passes through the light-transmitting plate 13 to be emitted from the light-emission surface of the light-transmitting plate 13. The other part of the light emitted from the LED element 12 enters the light-transmitting plate directly without reflection on the first reflector 14 and is emitted outside from the emission surface. In this way, almost all the light emitted from the LED element 12 is emitted from the emission surface of the light-transmitting plate 13 effectively. As a result, it enables efficient illumination for an object to be illuminated. Consequently, the illumination device can be applied to various illumination devices, such as an illumination bulb or the like.

Next, a method for manufacturing the illumination device in the first embodiment is described with reference to FIGS. 2 to 7B.

The manufacturing method includes, processes using a collective circuit board configured to manufacture multiple illumination devices simultaneously.

Figure 2:
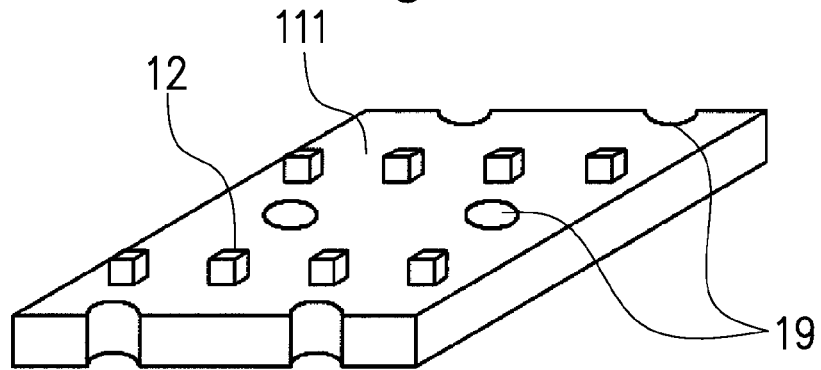
FIG. 2 is a perspective view showing a process of mounting a plurality of LED elements on a collective circuit board to manufacture illumination devices according to a first embodiment of the present invention.

A collective circuit board 111 as shown in FIG. 2 is first prepared. The collective circuit board 111 is generally available from substrate makers and has a structure in which copper foils are provided on both surfaces of the collective circuit board, half through-holes and through holes 19 are formed at predetermined positions of the collective circuit board to electrically connect the copper foils on the both surfaces, and electrode patterns are formed on the copper foils. A plurality of LED elements 12, blue LED elements in this embodiment are mounted on the collective circuit board 111 by die-bonding and electrically connected to the electrodes on the collective circuit board 111 by wire-bonding. Note that the electrodes, bonding wires and so on are not shown in FIG. 2.

Figure 3:
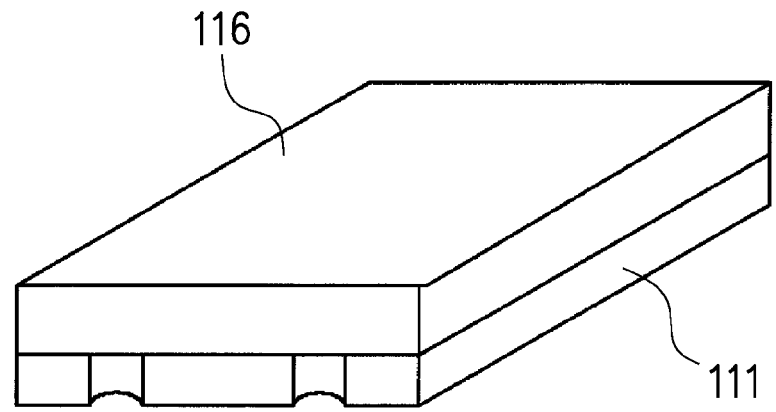
FIG. 3 is a perspective view showing a process of sealing a plurality of LED elements with a resin to manufacture illumination devices according to an embodiment of the present invention.

Next, as shown in FIG. 3, a light-transmitting sealing resin layer 116 containing at least one kind of fluorescent material, for example, a yellow fluorescent material is formed on the collective circuit board 111 to cover the plurality of LED elements 12 mounted on the collective circuit board 111, and thereby the entirety of the plurality of LED elements mounted on the collective circuit board 111 is sealed. In the sealing process, a pair of upper and lower molds are used. The collective circuit board 111 is disposed inside the lower mold and the upper mold is closed.

Thereafter, a space defined by the upper and lower molds is filled with a sealing resin, and the resin is hardened by heating and cooling process. The heating temperature of the sealing resin is about 100 to 200° C. and appropriately set in accordance with a resin to be used. If necessary, a process of defoaming, pressurization or the like may be added. After the sealing resin is hardened, the molds are opened, and the collective circuit board 111 with the sealing resin layer 116 is removed from the molds.

Figure 4:
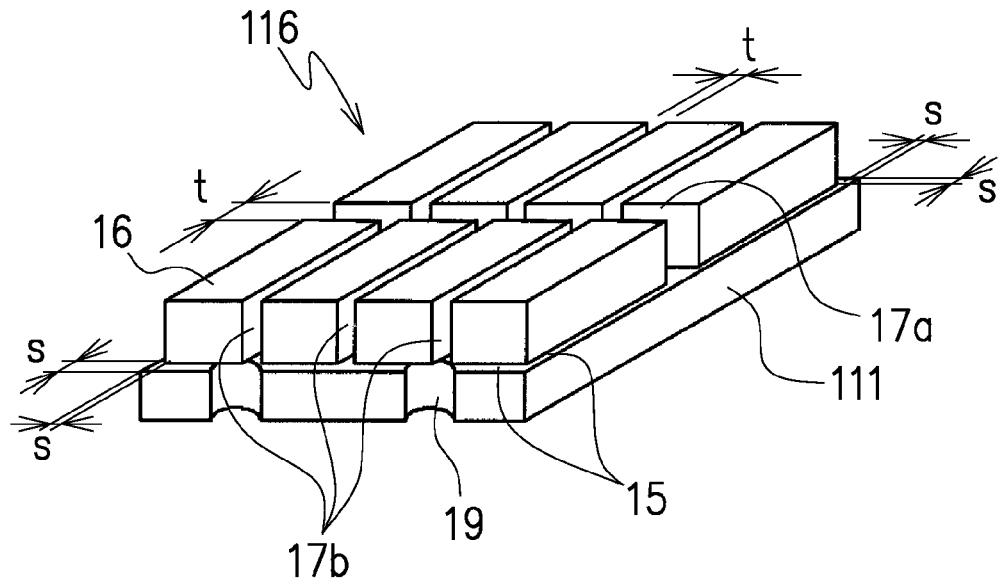
FIG. 4 is a perspective view showing a process of forming grooves in a sealing resin to manufacture illumination devices according to an embodiment of the present invention.

Next, as shown in FIG. 4, the sealing resin layer 116 is cut lengthwise and crosswise (in two directions perpendicular to each other) at positions where individual illumination devices 10 are divided in the final process to be described hereinafter by half dicing that cuts in the collective circuit board 111 slightly, thereby forming crosswise and lengthwise sealing resin-grooves 17a and 17b. At this time, a width (t) of each of the sealing resin-grooves 17a and 17b is set to be a value larger than a width of a blade used when dividing into individual illumination devices, as described hereinafter.

In addition, at the entire outer peripheral surfaces except an upper surface of the sealing resin layer 116, a portion of the resin layer 116 is removed by a width (s) to expose a part of upper surface of the collective circuit board 111, thereby forming an outer peripheral surfaces 15 exposed outside.

Figure 5:
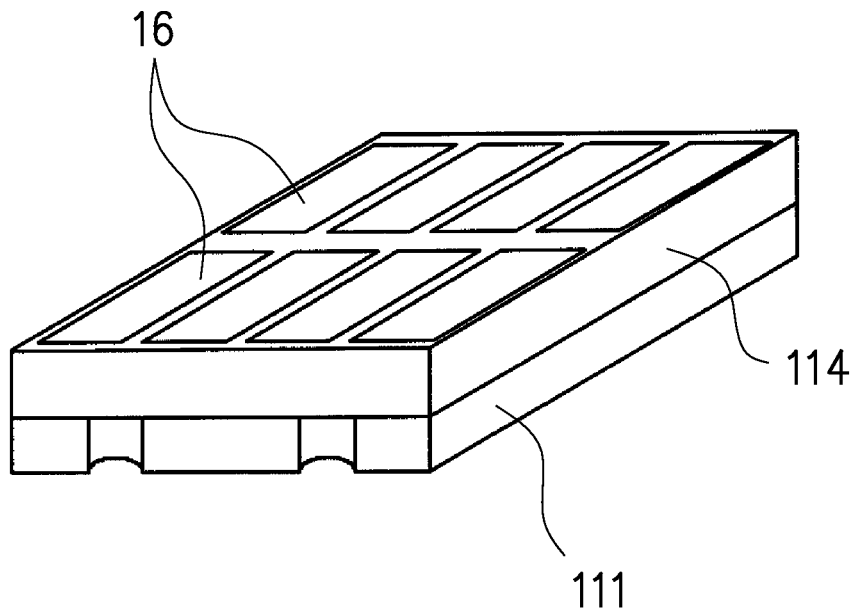
FIG. 5 is a perspective view showing a process of filling the grooves with a light reflecting resin to manufacture illumination devices according to an embodiment of the present invention.

Next, as shown in FIG. 5, grooves 17a and 17b of the sealing resin are filled with a light-reflecting resin which comprises silicone resin containing titanium oxide to form a light-reflecting resin layer 114. At this time, the light-reflecting resin layer 114 is preferably formed to have the same level as an upper surface of the sealing resin layer 116. The light-reflecting resin layer 114 is also formed on the outer peripheral surfaces 15 except the upper surface, and the light-reflecting resin layer 114 is provided the entire outer peripheral surfaces of the sealing resin layer 116 except the upper surface, so that the reflector has a surface substantially at a same level as the upper surface or the light emitting surface of the sealing resin layer 116. This process of filling with light-reflecting resin is also executed using a pair of upper and lower molds, similarly to the forming of the aforementioned sealing resin layer, but further description is omitted to avoid repetition.

Figure 6:
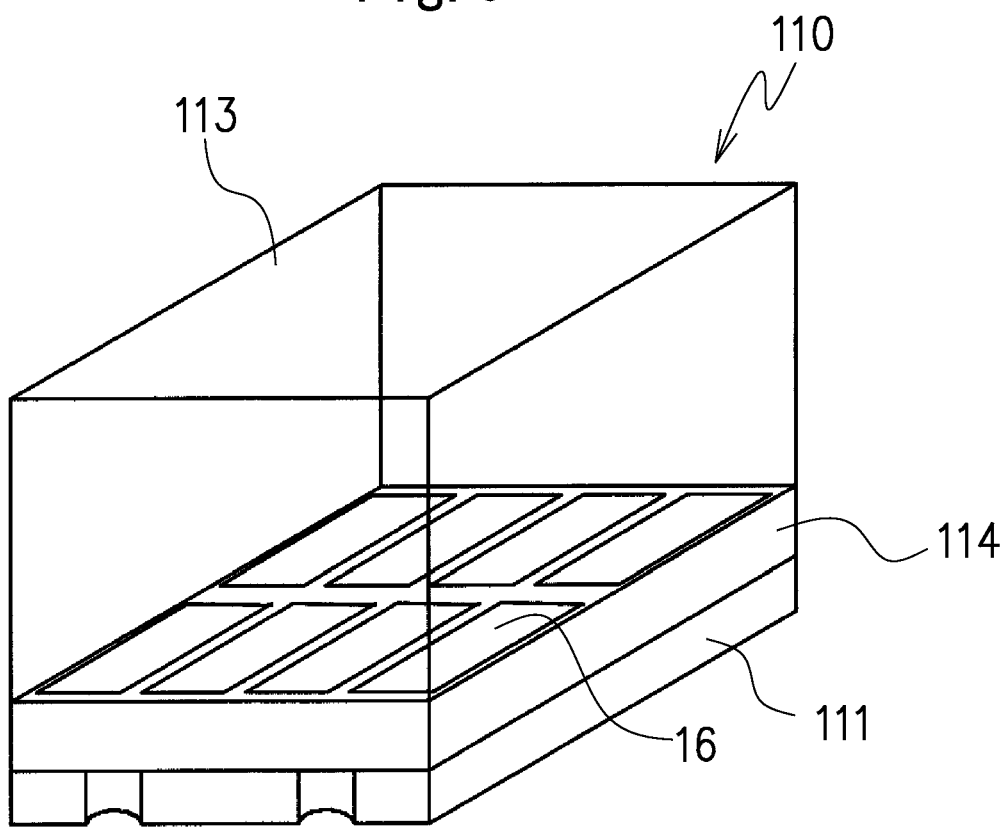
FIG. 6 is a perspective view showing a process of forming a light-guiding part comprising a light-transmitting resin plate on upper surfaces of the sealing resin and the light reflecting resin to manufacture illumination devices according to an embodiment of the present invention.

Next, as shown in FIG. 6, a light-guiding part 113 made of, for example, a light-transmitting silicone resin is formed on the upper surface of the sealing resin layer 116 and an upper surface of the light-reflecting resin part 114 to form an assembly 110 of illumination devices. The light-guiding part 113 is also formed using a pair of upper and lower molds, similarly to the forming of the aforementioned sealing resin layer.

Figure 7A:
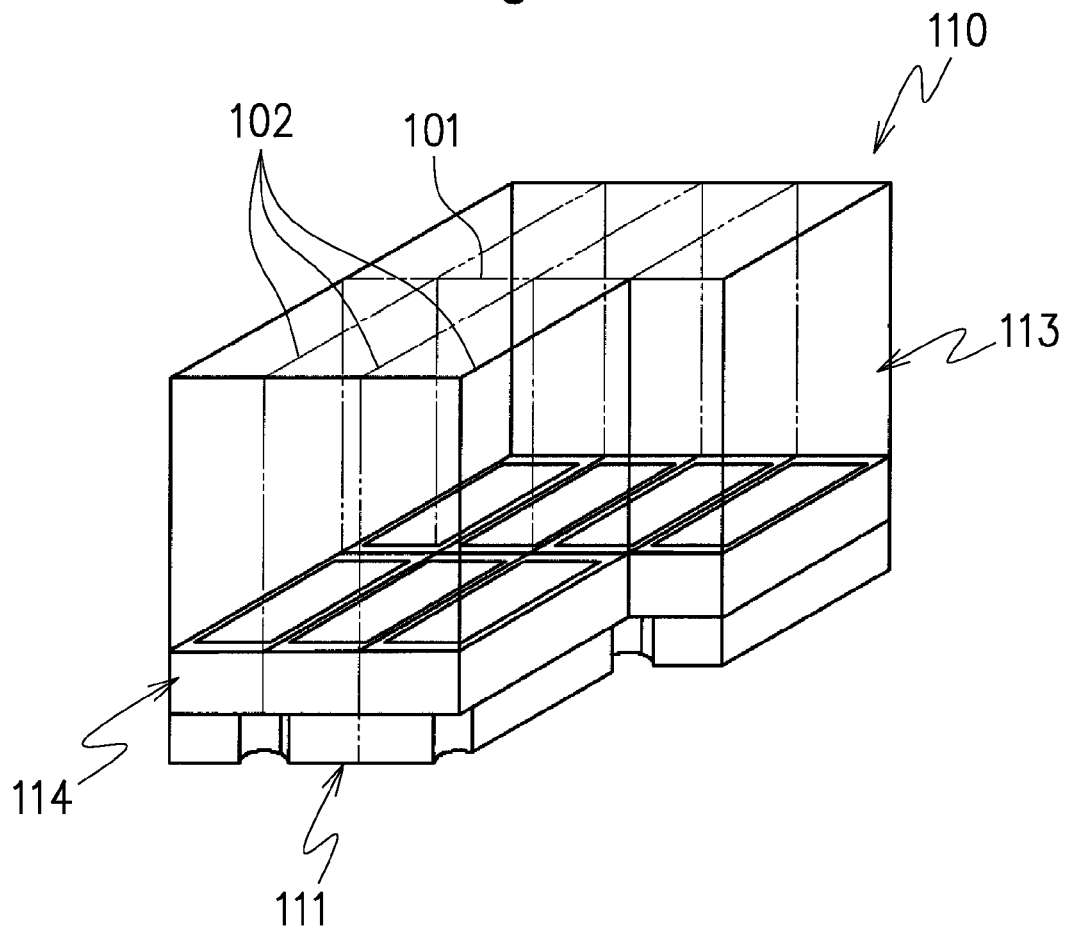
FIG. 7A is a perspective view showing a process of dividing the collective circuit board with respective mounting parts mounted on respective circuit boards into individual illumination devices to manufacture a plurality of illumination devices according to an embodiment of the present invention.
Figure 7B:
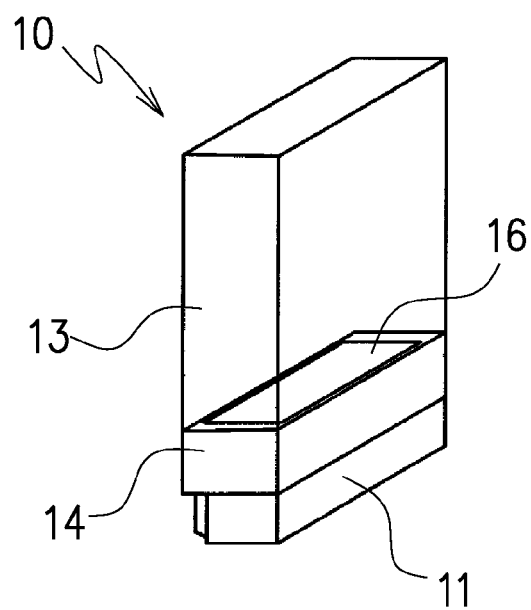
FIG. 7B is a perspective view showing one of illumination devices cut by a dividing process shown in FIG. 7A.

Next, as shown in FIGS. 7A and 7B, the assembly 110 of the illumination devices is divided at positions 101 and 102 corresponding to grooves 17a and 17b of the sealing resin by full dicing, whereby an individual illumination device 10 is acquired (see FIG. 7B). Note that, after the dicing process, the light emission surface 13a of the light-guiding part 13 may be polished to a mirror-like surface.

As mentioned above, in the method according to the present invention, because the illumination device can be mass-produced in simple processes, it is possible to achieve an illumination device of high reliability and low cost.

Figure 8A:
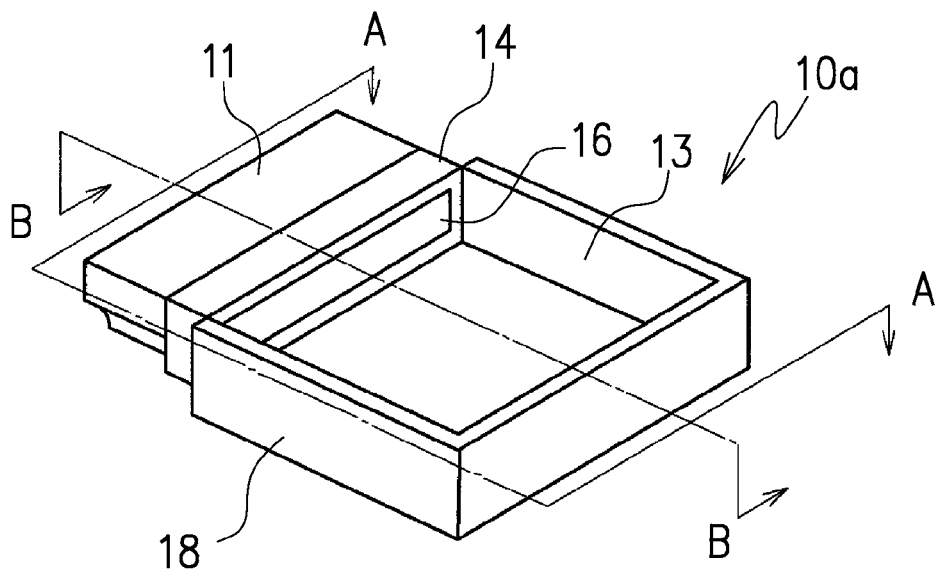
FIG. 8A is a perspective view showing another variation of an illumination device according to a second embodiment of the present invention.
Figure 8B:
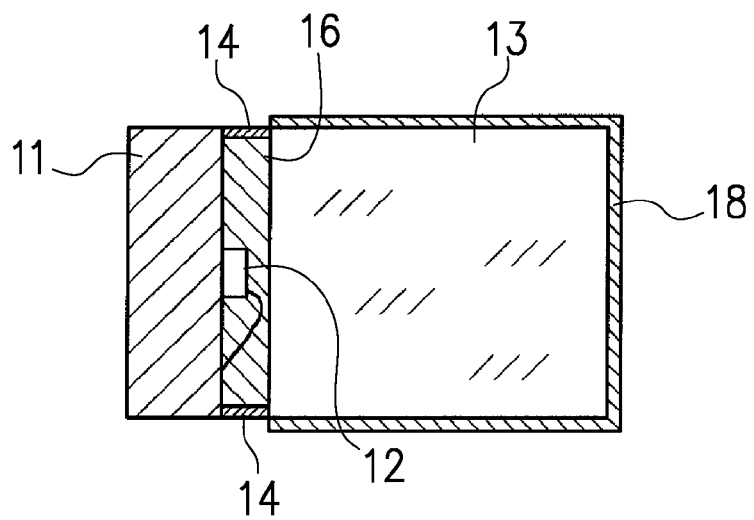
FIG. 8B is a sectional view taken along line A-A in FIG. 8A.
Figure 8C:
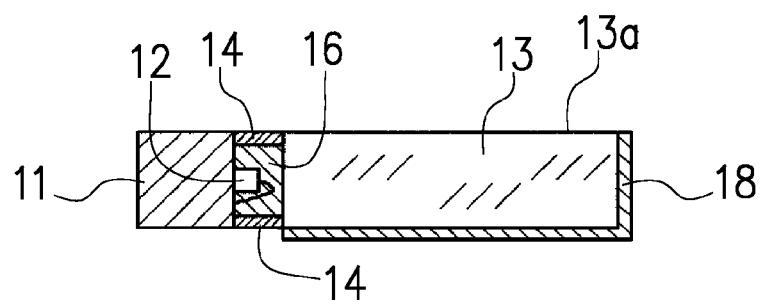
FIG. 8C is a sectional view taken along line B-B in FIG. 8A.

FIGS. 8A to 8C illustrate another example of the illumination device in the first embodiment.

An illumination device 10a as shown in FIGS. 8A to 8C 8C has a light emission surface of the light-guiding plate, and the light emission surface is at least one selected from surfaces perpendicular to the mount surface of the circuit board. Of the entirely of surfaces of the light-guiding part 13 in the illumination device 10 as shown in FIGS. 1A to 1C is formed as a light emission surface 13a, and a light reflector 18 is provided on each exposed surfaces of the light-guiding part, except for the light emission surface 13a. The light reflector 18 is referred to as a second light reflector in relation to the first light reflector 14. A metallic film having a high surface reflection coefficient and made of Al, Ag or the like is used for the second light reflector 18. The film preferably has a thickness of about 1 to 2 μm. Methods that may be applied for forming the metallic film are dry plating or wet plating such as vacuum deposition, spattering or the like.

Moreover, the aforementioned resin frame formed by the light-reflecting resin, which is made of the silicone resin containing the titanium oxide, may be used. The resin frame has preferably a thickness of about 30 to 50 μm.

In this way, because the light reflector 18 has a very thin thickness, the light-guiding part 13 has approximately the same plane as the adjacent surface of the circuit board 11, so that there is no problem with electrical connection even when mounting the illumination device 10a on a mother board.

As mentioned above, by providing the light reflector 18 on the light-guiding part 13, the illumination device 10a makes it possible to improve utilization efficiency of light and emit light with a high brightness from the light emission surface 13a. Consequently, if a liquid crystal display unit is disposed above the light emission surface 13a, it is possible to apply the illumination device as a backlight of the liquid crystal display unit. In addition, the illumination device can also be applied to a flash light or the like of a mobile phone with a camera.

Figure 9A:
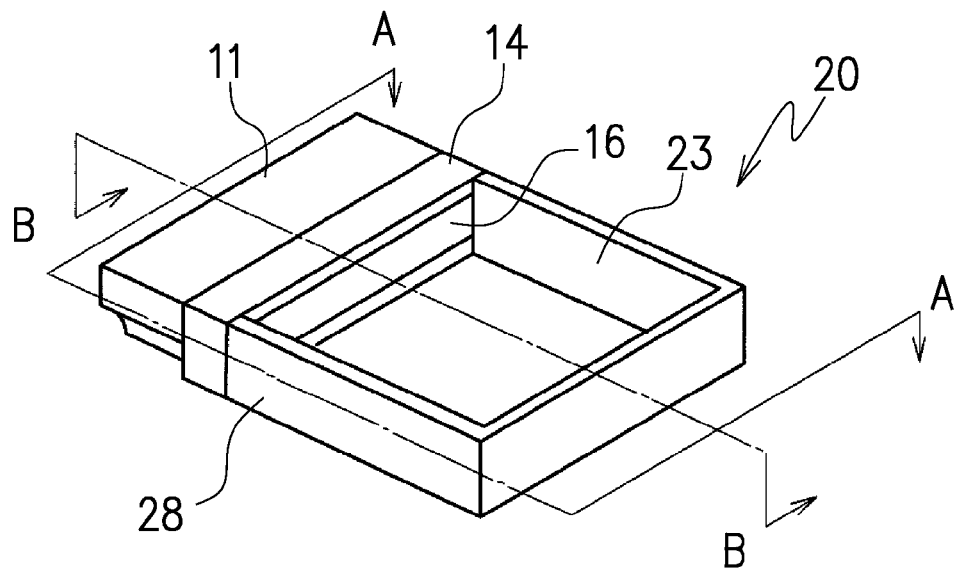
FIG. 9A is a perspective view showing an illumination device according to a second embodiment of the present invention.
Figure 9B:
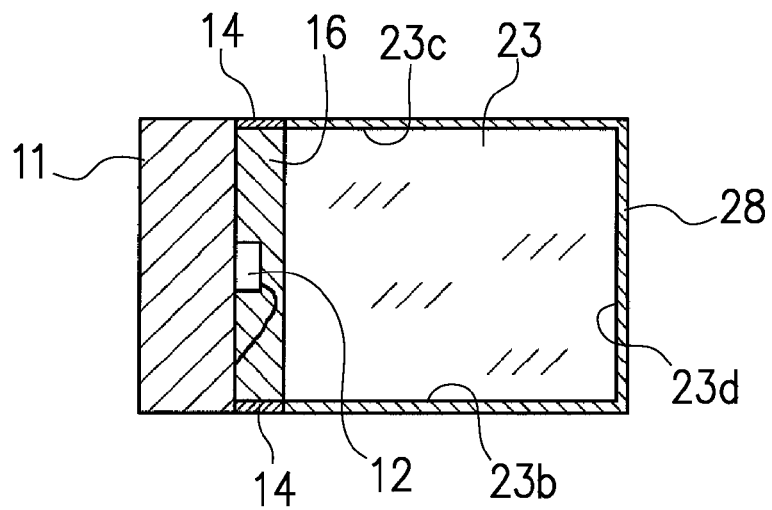
FIG. 9B is a sectional view taken along line A-A in FIG. 9A.
Figure 9C:
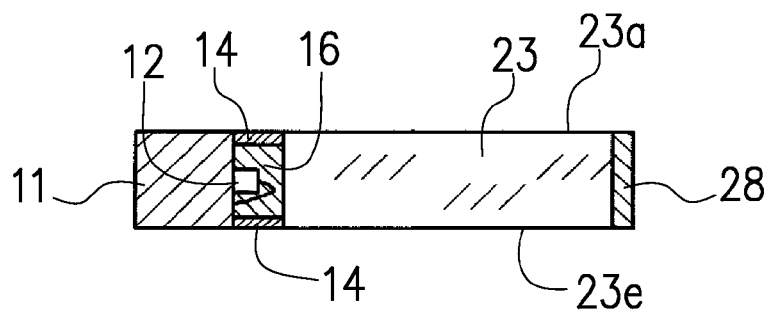
FIG. 9C is a sectional view taken along line B-B in FIG. 9A.

FIGS. 9A to 9C illustrate an illumination device in a second embodiment.

As shown in FIGS. 9A to 9C, the illumination device 20 in the second embodiment differs from the first embodiment in structure in that a light reflector 28 is provided on a pair of smaller peripheral surfaces 23b, 23c perpendicular to the mount surface of the circuit board and a surface 23d facing the mount surface, but excluding a light emission surface 23a of the light-guiding part 23 generally perpendicular to a surface of the circuit board H and a back surface 23e opposing the light emission surface 23a both of which are larger peripheral surfaces. Other structure of the illumination device 20 is the same as that of the illumination device 10. The light-guiding part 23 is the same in structure as the light-guiding part 13 in the first embodiment. In addition, the similar metallic film or light-reflecting resin used in the light reflector 18 in the first embodiment may be used for the light reflector 28. A detailed description of the illumination device 20 regarding the other structural elements similar to those in the first embodiment is omitted.

The illumination device 20 in the second embodiment can also be applied to various illumination devices such as an illumination bulb, a backlight of a liquid crystal display, a flash light of a mobile phone with a camera or the like.

Next, a method for manufacturing the illumination device in the second embodiment is described.

Because early processes of the method for manufacturing the illumination device in the second embodiment are the same as those in the first embodiment as mentioned with reference to FIGS. 2 to 6, a further description thereof is omitted.

Processes for manufacturing after the assembly 110 of illumination devices obtained by the process as shown in FIG. 6 is completed are described hereinafter. Note that, for convenience of explanation in the second embodiment, the light-reflecting resin parts 14 and 114 are referred to as first light reflectors 14 and 114, respectively, and the light-reflecting resin parts 24 and 124 formed on the light-guiding part 23 are referred to as second light reflectors 24 and 124, respectively.

Figure 10:
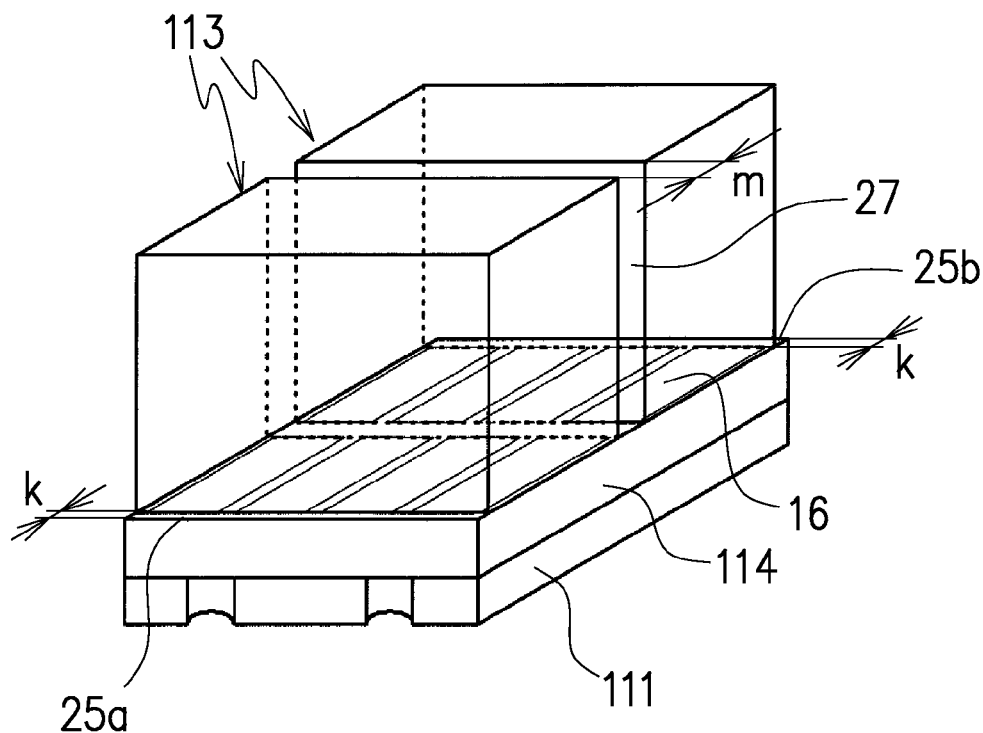
FIG. 10 is a perspective view showing a process of forming a light guiding part-groove in a light-guiding part comprising a light-transmitting resin plate to form illumination devices according to the second embodiment of the present invention.

After execution of similar processes to those described in the first embodiment with reference to FIGS. 2 to 6, a light-guiding part 113 of the assembly 110 is divided by half dicing that cuts the first light-reflecting resin part 114 slightly at a position corresponding to the crosswise sealing resin-groove 17a shown in FIG. 4 to form a light guiding part-groove 27, as shown in FIG. 10.

At this time, a width (m) of the light guiding part-groove 27 is preferably set to be smaller than the width (t) of each of the crosswise and lengthwise sealing resin-grooves 17a and 17b shown in FIG. 4 and larger than a width of a blade used when dividing the assembly into individual illumination devices which is described hereinafter. In addition, each of opposite side surfaces of the light-guiding part 113 parallel to the light guiding part-groove 27 is removed to a width (k) to form outer peripheral exposed portions 25a and 25b exposing a surface of the collective circuit board 111.

Figure 11:
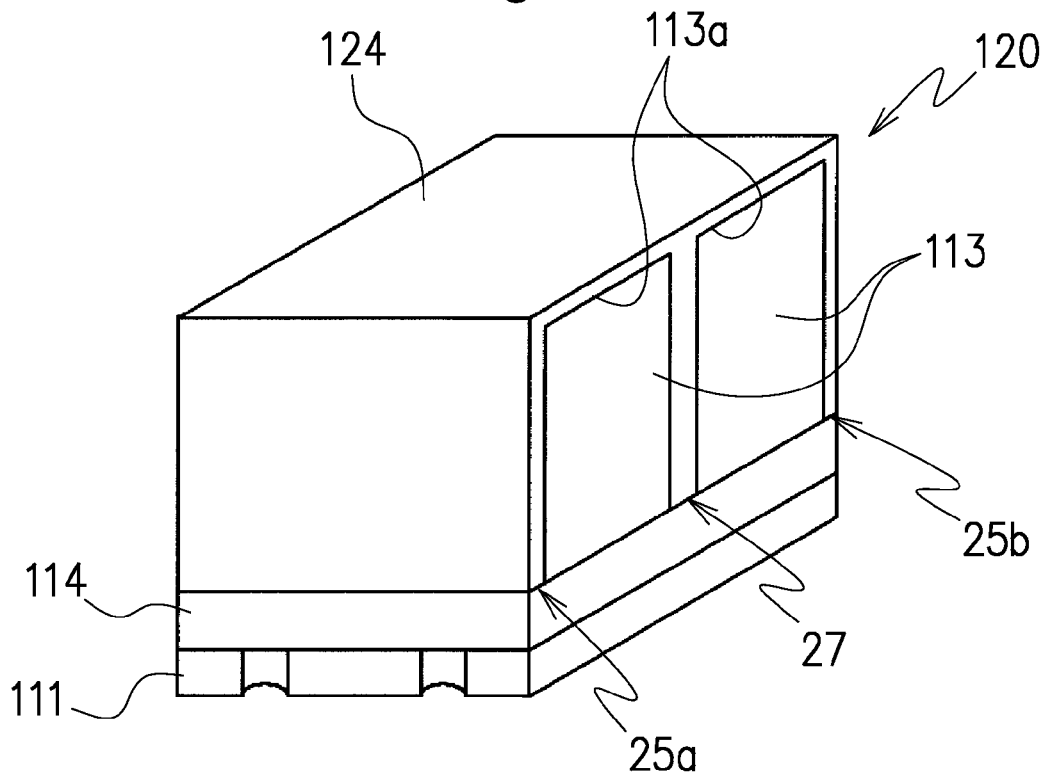
FIG. 11 is a perspective view showing a process of forming a second light reflector in a groove and on a pair of opposing peripheral surfaces and on an upper surface of the light-guiding part to form the illumination device according to a second embodiment of the present invention.

Next, the second light-reflecting resin part 124 is formed on an upper surface 113a of the light-guiding part 113 and provided in the light guiding part-groove 27, as shown in FIG. 11.

At this time, the outer peripheral exposed portions 25a and 25b provided on the opposite side surfaces of the light-guiding part 113 parallel to the light guiding part-groove 27 are formed to be the same level as the second light-reflecting resin part 124, thereby forming an assembly 120 of illumination devices. A pair of upper and lower molds are used for a process of forming the second light-reflecting resin part 124, similarly to the forming of the light-transmitting sealing resin in the first embodiment, but further description regarding this is omitted to avoid repetition.

Figure 12A:
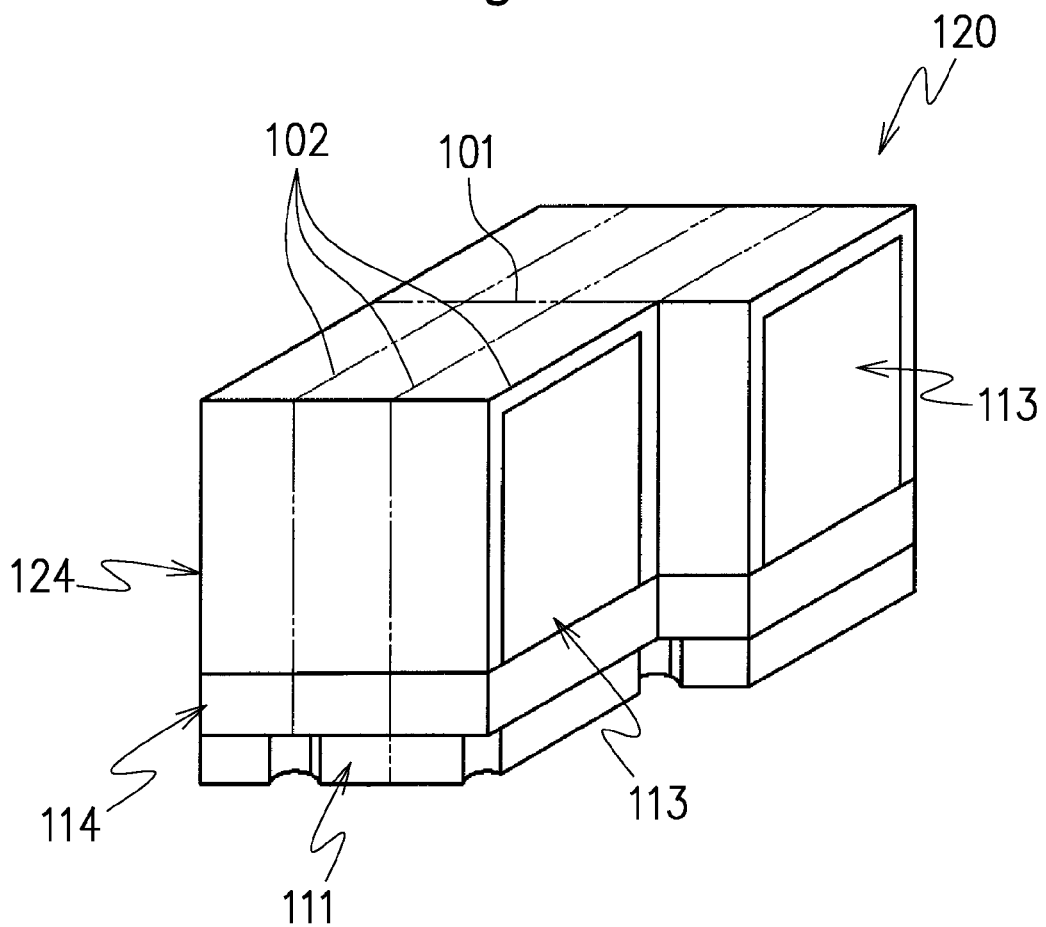
FIG. 12A is a perspective view showing a process of dividing a collective circuit board with parts mounted on respective circuit boards to form illumination devices according to an embodiment of the present invention.
Figure 12B:
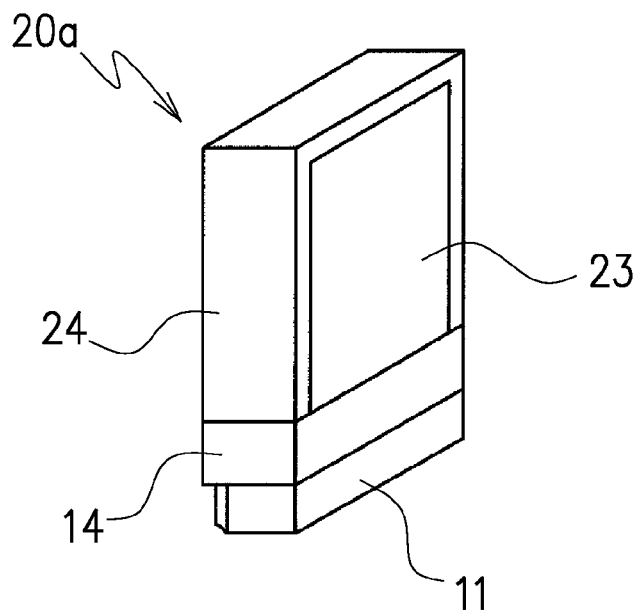
FIG. 12B is a perspective view showing one of the illumination devices cut by the dividing process shown in FIG. 12A.

Next, the assembly 120 of illumination devices is divided at positions 101 and 102 corresponding to the sealing resin-grooves 17a and 17b shown in FIG. 4 by full dicing to form an individual illumination device 20a, as shown in FIGS. 12A and 12B. Thereby, it is possible to acquire illumination device 20a in each of which the first light reflector 14 is formed in the peripheral surfaces of the light-transmitting sealing resin, and the second reflector 24 is formed on peripheral surfaces of the light-transmitting plate 23 excepting the light emission surface 23a and the back surface 23e.

Note that the same effect can also be obtained in the manufacturing method in the second embodiment as in that in the first embodiment.

Figure 13:
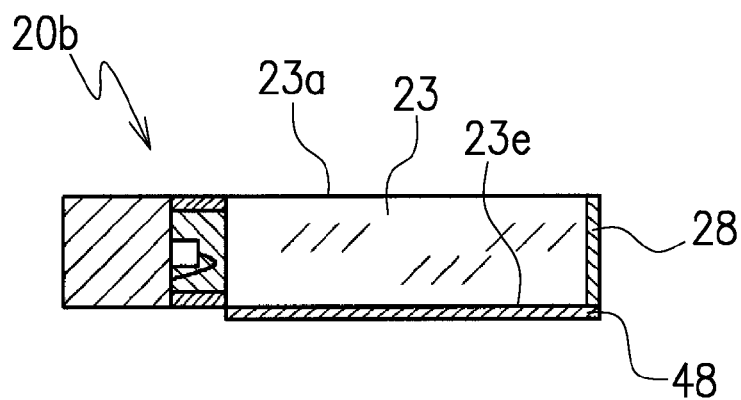
FIG. 13 is a sectional view showing another variation of an illumination device according to a second embodiment of the present invention.

FIG. 13 illustrates another example of the illumination device in the second embodiment.

As shown in FIG. 13, an illumination device 20b according to the other example has a structure in which a light reflector 48 is provided on the back surface 23e opposing the light emission surface 23a of the light-guiding part 23 of the aforementioned illumination device 20 shown in FIG. 9.

A light-reflecting resin comprising a metallic film made of Al, Ag or the like, or silicone resin containing titanium oxide is used for a material of the light reflector 48, similarly to the light reflector 18 in the first embodiment. Note that, the light reflector 48 preferably has a very thin thickness, similarly to the light reflector 18. Therefore, the light-guiding part 23 has approximately the same plane as the surface of the adjacent circuit board 11, thereby enabling avoidance of any problem with electrical connection even when mounting the illumination device 20a on a mother board.

Figure 14A:
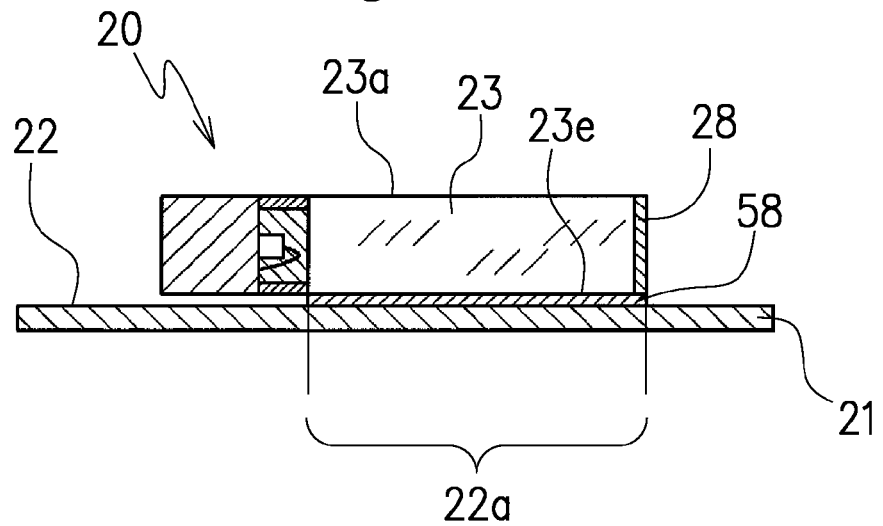
FIG. 14A is a sectional view showing a further another variation of an illumination device according to a second embodiment of the present invention.
Figure 14B:
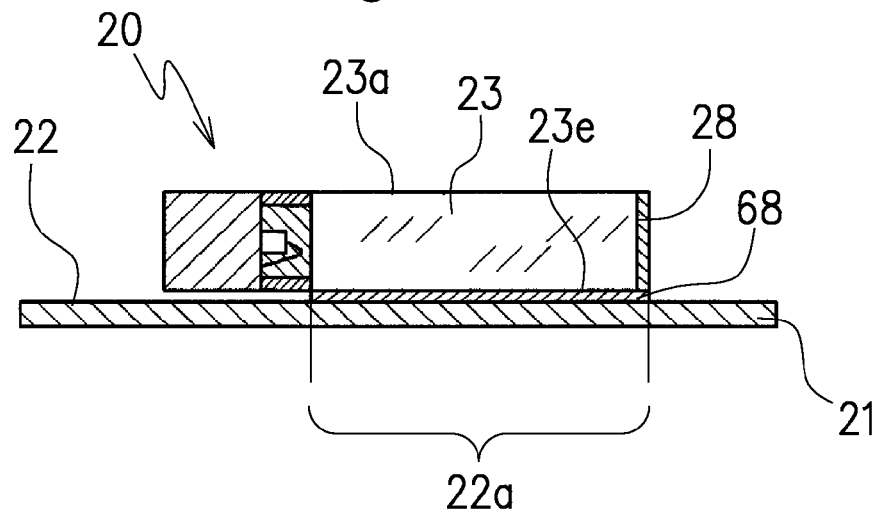
FIG. 14B is a sectional view showing yet another variation of an illumination device according to second embodiment of the present invention.

FIGS. 14A and 14B illustrate an example in which the illumination device 20 in the second embodiment is mounted on a mother board 21.

FIG. 14A illustrates an example in which a light reflector 58 is provided on an area 22a of a surface 22 of the mother board 21 facing the light-guiding part 23. The metallic film or light-reflecting resin similar to the light reflector 18 may be used for a material of the light reflector 58. Alternatively, a white paint may be applied to a surface of the light reflector made of any material, thereby enabling improvement in utilization efficiency of light.

FIG. 14B illustrates an example in which a colored layer 68 is provided on the area 22a of the surface 22 of the mother board 21. The colored layer 68 can be formed by applying or printing a light sensitive material on the area 22a and irradiating light thereon. The colored layer may also be formed by applying paint to the area 22a, or adhering a colored tape to the area 22a. Consequently, it is not possible to view the surface 22 of the mother board 21 facing the light-guiding part 23, thereby improving the external appearance quality of the illumination device. In addition, by setting a color of the colored layer 68 to be approximately the same as that of a case of an instrument in which the illumination device is installed, the external appearance quality of the illumination device can be further improved.

Note that, because each of the light reflector 58 and the colored layer 68 preferably has a very thin thickness, similarly to the light reflector 18, and therefore the light-guiding part 23 has approximately the same plane as the surface of the adjacent circuit board 11, there is no problem with electrical connection even when mounting the illumination device 20 on a mother board 21.

Figure 15A:
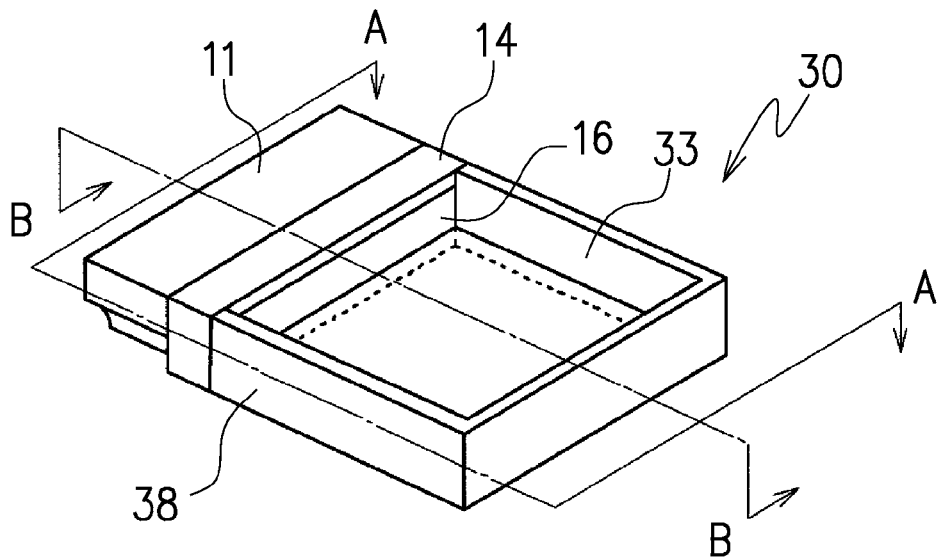
FIG. 15A is a perspective view showing an illumination device according to a third embodiment of the present invention.
Figure 15B:
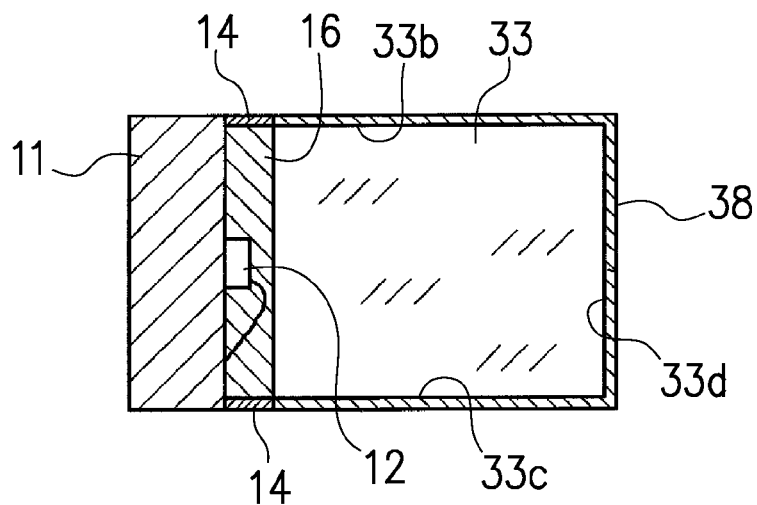
FIG. 15B is a sectional view taken along line A-A in FIG. 15A.
Figure 15C:
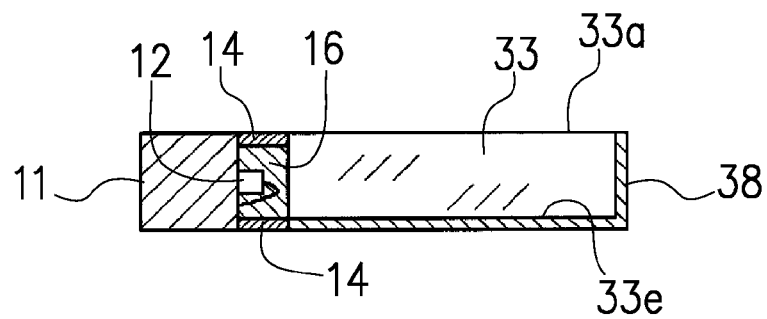
FIG. 15C is a sectional view taken along line B-B in FIG. 15A.

FIGS. 15A to 15C illustrate an illumination device in a third embodiment.

As shown in FIGS. 15A to 15C, the illumination device 30 in the third embodiment differs from the first embodiment in structure in that a light reflector 38 is provided on each of surfaces 33b, 33c, 33d and 33e of a light-guiding part 33, but excluding a light emission surface 33a of the light-guiding part 33 generally perpendicular to the surface of the circuit board 11 on which the LED element 12 is mounted. Other structure of the illumination device 30 is the same as that of the illumination device 10 in the first embodiment.

The light-guiding part 33 is the same in structure as the light-guiding part 13 in the first embodiment. In addition, the similar metallic film or light-reflecting resin used in the light reflector 18 in the first embodiment may be used for the light reflector 38. A detailed description of the illumination device 30 regarding the other structural elements similar to those in the first embodiment is omitted.

The illumination device 30 in the third embodiment has high utilization efficiency and can be applied to various illuminated devices such as an illumination bulb, a backlight of a liquid crystal display, a flash light of a mobile phone with a camera or the like, similarly to the second embodiment.

Next, a method for manufacturing the illumination device in the third embodiment is described with reference to FIGS. 16 to 18B.

Because early processes of the method for manufacturing the illumination device in the third embodiment are the same as those in the first embodiment as mentioned with reference to FIGS. 2 to 6, a further description thereof is omitted.

Manufacturing processes following completion of the process in which the light guiding part-groove 27 is formed in the assembly 110 of illumination devices shown in FIG. 10 are described hereinafter. Note that, for convenience of explanation in the third embodiment, the light guiding part-groove 27 is referred to as a first light guiding part-groove 27.

Figure 16:
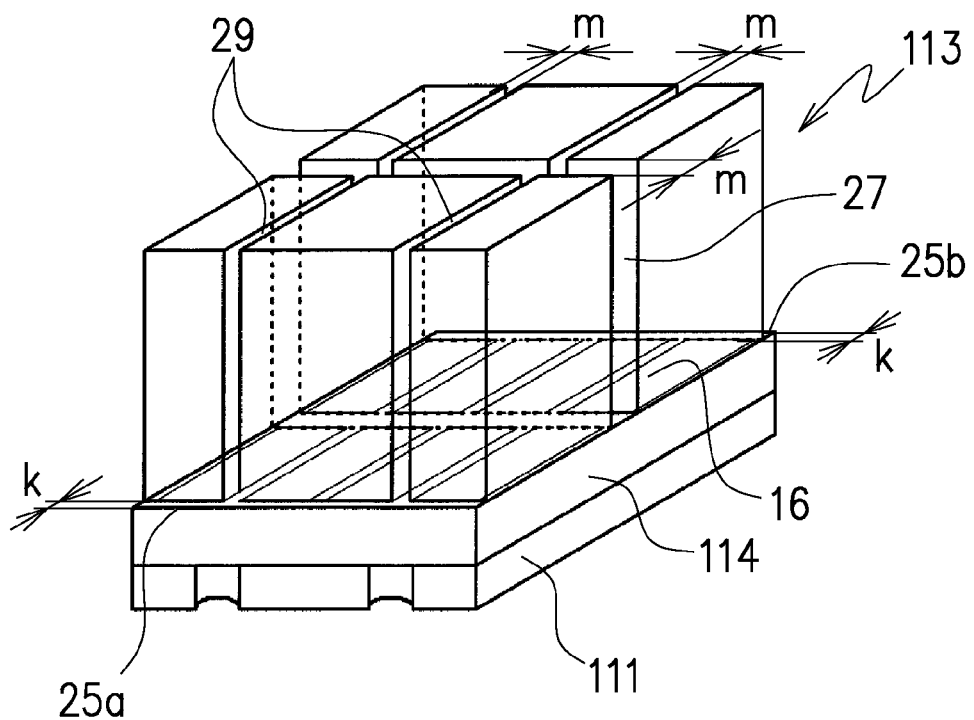
FIG. 16 is a perspective view showing a process of forming grooves in a light-guiding part which is dividable to a plurality of light-transmitting plates of illumination devices according to a third embodiment of the present invention.

After the first light guiding part-groove 27 as described with reference to FIG. 10 in the second embodiment is formed, a plurality of second light guiding part-grooves 29 are formed by dividing the light-guiding part 113 lengthwise by half dicing that cuts slightly into the first light-reflecting resin part 114 at positions corresponding to, for example, both side grooves, but not the central groove of the lengthwise sealing resin-grooves 17b shown in FIG. 4, as shown in FIG. 16. At this time, each of the second light guiding part-grooves 29 has a width (m) set to be the same as the width (m) of the first light guiding part-groove 27.

Figure 17:
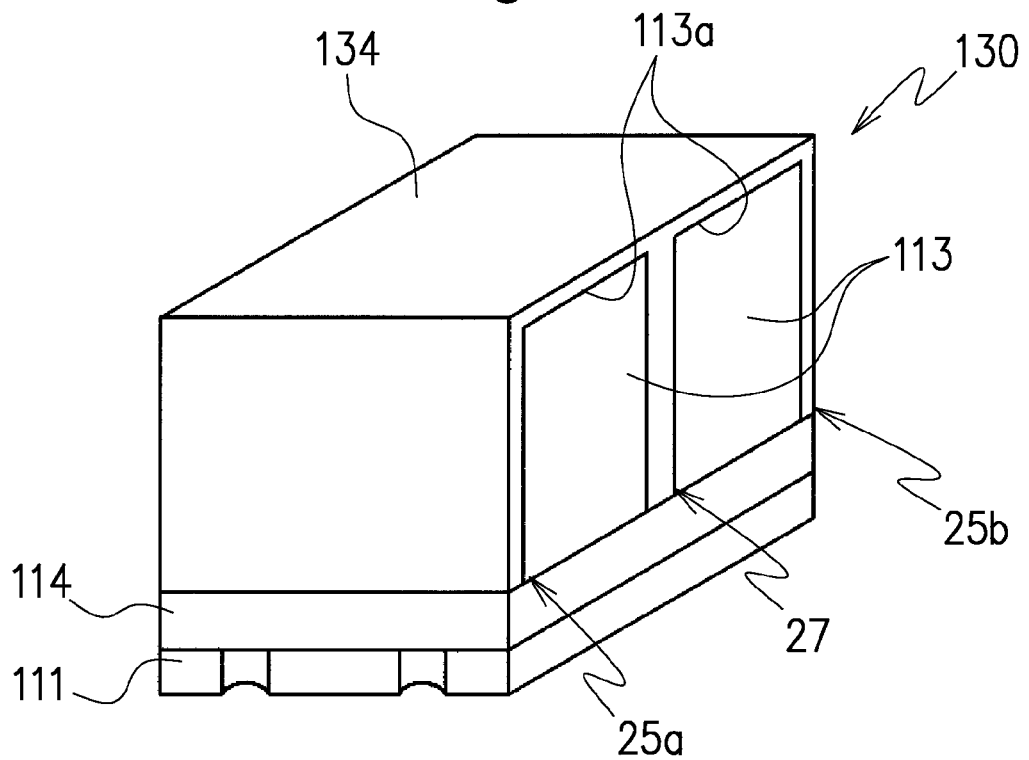
FIG. 17 is a perspective view showing a process of forming a second reflector in grooves and on a pair of opposing peripheral surfaces and on an upper surface of the light-guiding part to form illumination devices according to a third embodiment of the present invention.

Next, as shown in FIG. 17, a second light-reflecting resin part 134 is formed on the upper surface 113a of the light-guiding part 113 and provided in the first and second light guiding part-grooves 27 and 29. At this time, the second light-reflecting resin part 134 is also formed at the same level on the outer peripheral exposed portions 25a and 25b provided on the opposite side surfaces of the light-guiding part 113 parallel to the first light guiding part-groove 27, thereby forming an assembly 130 of illumination devices. A pair of upper and lower molds are used for a process of forming the second light-reflecting resin part 134, similarly to the forming of the light-transmitting sealing resin in the first embodiment.

Figure 18A:
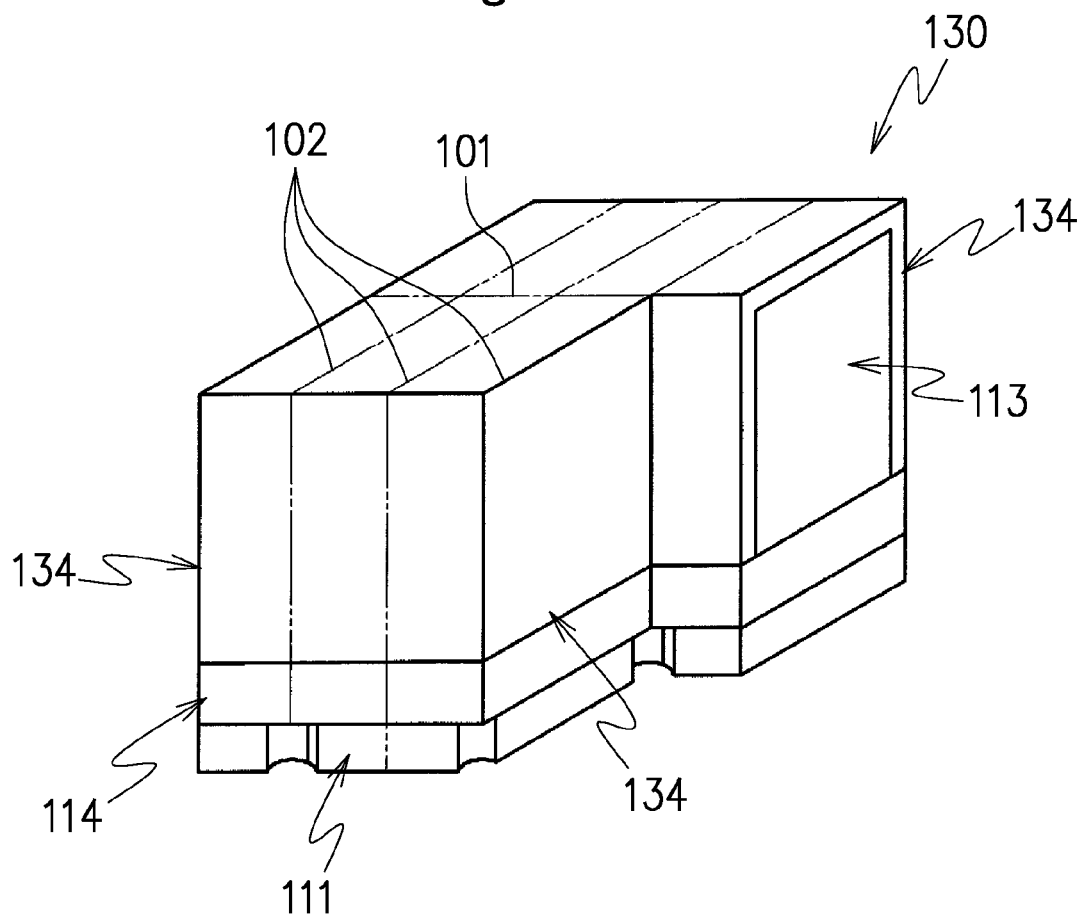
FIG. 18A is a perspective view showing a process of dividing a collective circuit board with respective parts mounted on respective circuit boards into individual illumination devices according to a third embodiment of the present invention.
Figure 18B:
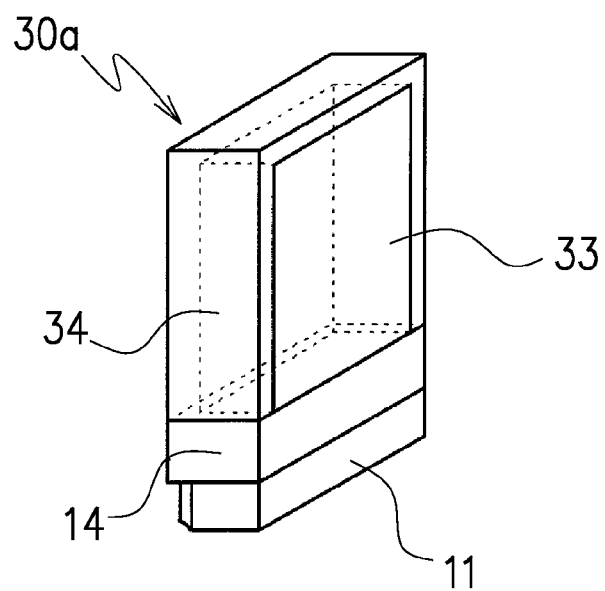
FIG. 18B is a perspective view showing one of the illumination devices cut by the dividing process as shown in FIG. 18A.
Figure 19A:
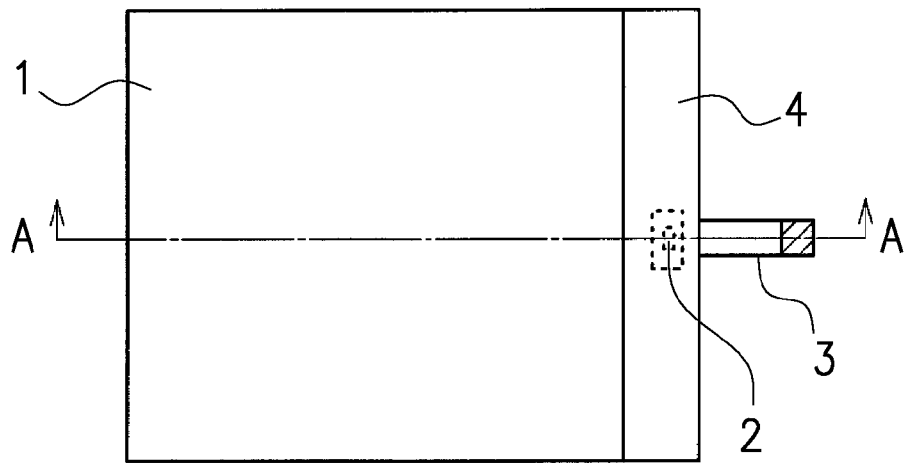
FIG. 19A is a schematic plan view showing a camera module in which a conventional illumination device is installed.
Figure 19B:
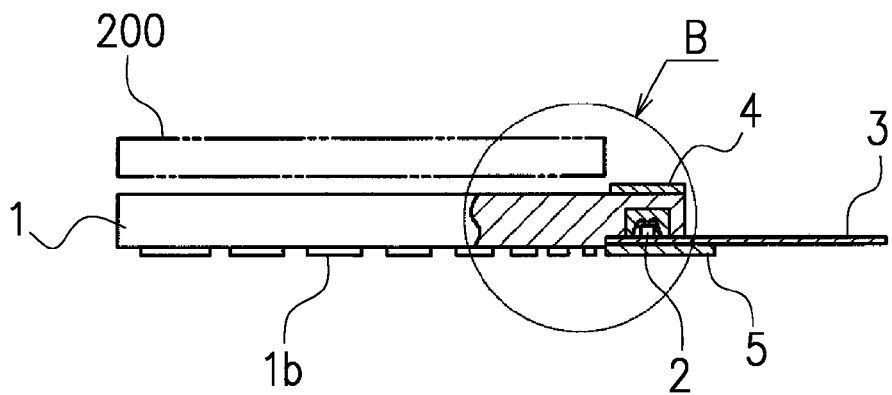
FIG. 19B is a sectional view taken along line A-A of FIG. 19A.
Figure 19C:
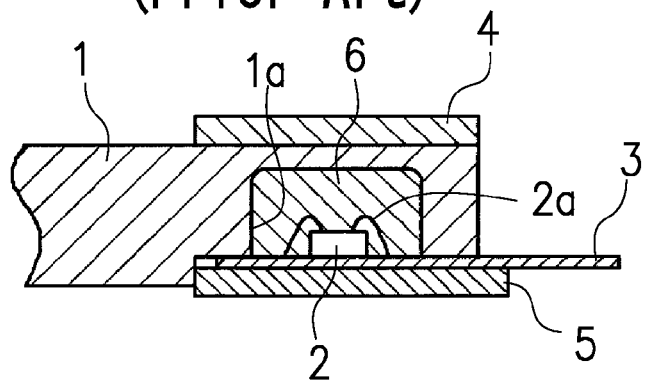
FIG. 19C is an enlarged sectional view of a portion B of FIG. 19B.

Next, as shown in FIGS. 18A and 18B, the assembly 130 of illumination devices is divided at the positions 101 and 102 corresponding to the sealing resin-grooves 17a and 17b shown in FIG. 4 by full dicing to form an individual illumination device 30a. Thereby, it is possible to acquire the illumination device 30a in which the first light-reflecting resin part 14 is formed in the periphery of the light-transmitting sealing resin, and the second light-reflecting resin part 34 is formed on surfaces of the light-guiding part 23 excepting the light emission surface 23a of the light-guiding part 23.

Note that the manufacturing method in the third embodiment has the same effect as that in the first embodiment.

With the structure as mentioned above, the present invention makes it possible to achieve a thin and compact illumination device having high reliability and a method capable of mass-producing such an illumination device using a simple process and at low cost.

Furthermore, the present invention makes it possible to provide an illumination device capable of emitting uniform illumination light at low cost and a method capable of manufacturing the illumination device on a large scale with a high yield.

Although the preferred embodiments of the present invention have been described, it should be understood that the present invention is not limited to these embodiments, and that various modifications and changes can be made to the embodiments.

In the aforementioned embodiments, although a case where one LED element is mounted on the circuit board has been described, the number of LED elements is not limited, and any number of LED elements can be used, according to necessity.

In the above, the light-guiding part of the light-transmitting plate has been made of a light-transmitting resin, but a product with a glass light-guiding part having a light-transmitting property can also be considered.

In addition, in the above, although a blue LED element has been used as the LED light source and the sealing resin has been configured to contain yellow fluorescent material, the LED light source and the sealing resin are not limited to these, and other LED elements and other fluorescent materials can be used for the LED light source and the sealing resin.

What is claimed is:

1. An illumination device, comprising:
   a circuit board having a mount surface;
   at least one light-emitting diode element mounted on the mount surface of the circuit board;
   a light-transmitting sealing resin mounted on the mount surface, covering the light-emitting diode element and containing at least one kind of fluorescent material, the light-transmitting sealing resin having peripheral surfaces, and a light-emitting surface that faces the mount surface of the circuit board and;
   a light reflector layered on and covering the peripheral surfaces of the light-transmitting sealing resin except the light-emitting surface, and the light reflector configured to reflect light thereon, after the light emitted from the light-emitting diode element in the light-transmitting sealing resin; and
   a light-transmitting plate connected to light-emitting surface of the light-transmitting sealing resin,
   the light-transmitting plate including at least one light emission surface, and the light-transmitting plate that receives light through the light-emitting surface of the light-transmitting sealing resin.

2. The illumination device according to claim 1, further comprising;
   the light reflector defined as a first light reflector;
   the light emission surface of the light-transmitting plate being disposed substantially perpendicular to the mount surface on which the light-emitting diode element is mounted, and
   a second light reflector being layered on surfaces of the light-transmitting plate except the light emission surface and a surface contacting the light-emitting surface of the light-transmitting sealing resin.

3. The illumination device according to claim 1, further comprising;
   the light reflector defined as a first light reflector;
   the light emission surface of the light-transmitting plate being substantially perpendicular to the mount surface of the circuit board, the mount surface on which the light-emitting diode element is mounted, and
   a second light reflector is disposed on surfaces of the light-transmitting plate except the light emission surface.

4. The illumination device according to claim 2,
   each of the first light reflector and the second light reflector includes one selected from a metallic layer and a light-reflecting resin layer.

5. The illumination device according to claim 2,
   further comprising a mother board disposed perpendicularly to the mount surface of the circuit board,
   at least one of a light-reflecting layer and a colored layer provided on a surface of the mother board, the surface facing the light-transmitting plate.

6. The illumination device according to claim 5,
   wherein the colored layer comprises a light sensitive material.

7. The illumination device according to claim 5,
   wherein the light-reflecting layer is one of a metallic film and a light-reflecting resin film.

8. An illumination device, comprising:
   a circuit board having a mount surface and electrodes;
   at least one light-emitting diode element mounted on the mount surface of the circuit board and electrically connected to the electrodes;
   a light-transmitting sealing resin provided on the mount surface and sealing the light-emitting diode element and including a light-emitting surface opposing to the mount surface, a contact surface in contact with the mount surface and peripheral surfaces disposed between the light-emitting surface and the contact surface;
   a first light reflector layered on the peripheral surfaces of the light-transmitting sealing resin;
   a light-transmitting plate coupled to the light-emitting surface of the light-transmitting sealing resin and including a coupled surface coupled to the light-transmitting sealing resin, an opposing surface that opposes the coupled surface and peripheral surfaces disposed between the coupled surface and the opposing surface;
   a light-emitting surface provided on at least one of the opposing surface and the peripheral surfaces of the light-transmitting plate; and
   a second light reflector configured to cover the opposing surface and the peripheral surfaces of the light-guiding plate other than the light-emitting surface.

9. The illumination device according to claim 8,
   further comprising a mother board disposed perpendicularly to the mount surface of the circuit board and facing one of the peripheral surfaces of the light-guiding plate,
   at least one of a light-reflecting layer and a colored layer provided on a surface of the mother board, the surface facing one of the peripheral surfaces of the light-transmitting plate as at least one of the second light reflector.

10. The illumination device according to claim 9,
    wherein the colored layer has light sensitivity.

11. The illumination device according to claim 8,
    wherein at least one of the first light reflector and the second light reflector comprises one selected from a metallic film and a light-reflecting white-colored film.

* * * * *